United States Patent
Eto et al.

(10) Patent No.: US 7,501,711 B2
(45) Date of Patent: Mar. 10, 2009

(54) EPOXY RESIN COMPOSITION FOR SEMICONDUCTOR ENCAPSULATION AND SEMICONDUCTOR DEVICE USING THE SAME

(75) Inventors: Takuya Eto, Ibaraki (JP); Kazuhiro Ikemura, Ibaraki (JP); Eiji Toyoda, Ibaraki (JP); Katsuyuki Nakabayashi, Ibaraki (JP); Daisuke Tsukahara, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 33 days.

(21) Appl. No.: 11/665,967

(22) PCT Filed: Oct. 18, 2005

(86) PCT No.: PCT/JP2005/019108

§ 371 (c)(1),
(2), (4) Date: Apr. 20, 2007

(87) PCT Pub. No.: WO2006/046440

PCT Pub. Date: May 4, 2006

(65) Prior Publication Data

US 2008/0136048 A1 Jun. 12, 2008

(30) Foreign Application Priority Data

Oct. 27, 2004 (JP) .............................. 2004-312730

(51) Int. Cl.
*H01L 23/28* (2006.01)

(52) U.S. Cl. ...................... 257/787; 428/413
(58) Field of Classification Search ................. 428/413; 257/787; 438/112, 124, 126, 127
See application file for complete search history.

(56) References Cited

U.S. PATENT DOCUMENTS

| | | | |
|---|---|---|---|
| 6,376,101 B1 * | 4/2002 | Ota | 428/620 |
| 7,023,098 B2 * | 4/2006 | Umeno et al. | 257/787 |
| 7,291,684 B2 * | 11/2007 | Umeno et al. | 525/481 |

FOREIGN PATENT DOCUMENTS

| JP | 09-173890 A | 7/1997 |
|---|---|---|
| JP | 2000-136289 A | 5/2000 |
| JP | 2000-332165 A | 11/2000 |

\* cited by examiner

*Primary Examiner*—Roy K Potter
(74) *Attorney, Agent, or Firm*—Sughrue Mion, PLLC

(57) ABSTRACT

An epoxy resin composition for semiconductor encapsulation which does not contain conductive foreign metallic particles having such a size that they cannot be detected and eliminated by the conventional method for eliminating conductive foreign metallic particles. The epoxy resin composition for semiconductor encapsulation comprises the following components (A) to (D). Conductive foreign metallic particles having a size of 20 μm or more are substantially not contained in the aforementioned epoxy resin composition.
  (A) An epoxy resin.
  (B) A phenol resin.
  (C) A hardening accelerator.
  (D) An inorganic filler.

3 Claims, 1 Drawing Sheet

[Fig. 1]
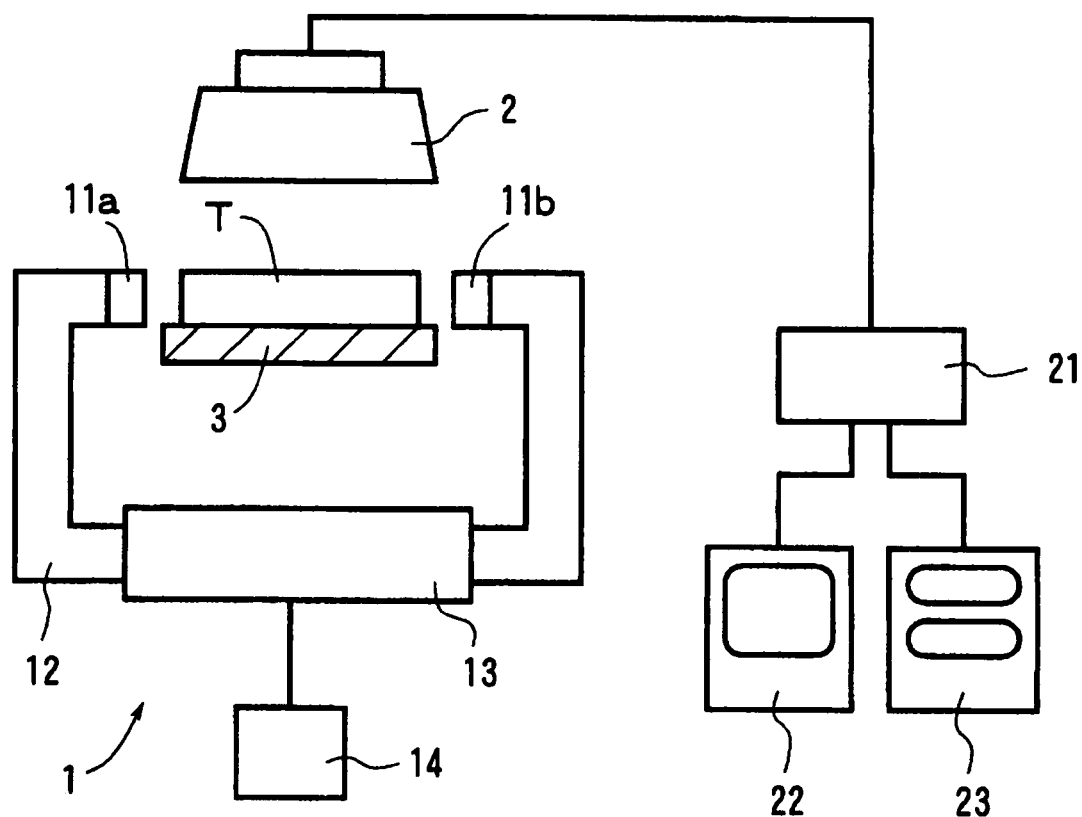

EPOXY RESIN COMPOSITION FOR SEMICONDUCTOR ENCAPSULATION AND SEMICONDUCTOR DEVICE USING THE SAME

FIELD OF THE INVENTION

The present invention relates to an epoxy resin composition for semiconductor encapsulation which does not substantially contain conductive foreign metallic particles having a predetermined size or more and from which a high reliability semiconductor device can be obtained, as well as a semiconductor device that uses the same.

BACKGROUND ART

In the conventional semiconductor devices, a semiconductor element (semiconductor chip) is mounted on a metal lead frame. In order to assure continuity with the outside, the aforementioned semiconductor element and the inner lead of the aforementioned lead frame are connected by bonding a metal wire. In addition, the aforementioned semiconductor element and lead frame are encapsulated with an epoxy resin composition.

With the recent advance in the high performance of electric products, mobile phones and the like, miniaturization, thinning and high performance are in demand for semiconductor devices as well. In order to realize this, semiconductor device forms such as TSOP (thin and small outline package), QFP (quad flat package) and the like have been developed. In addition, since the lead frame-type semiconductor devices have a limitation in terms of the number of external leads, development of BGA (ball grid array), LGA (land grid array) and the like which use balls and lands instead of leads for effecting continuity is also in progress.

Thus, with the advance of miniaturization and high performance gaining, pitch of metal wires inside the semiconductor device also became narrow, and some of the latest semiconductor devices have a metal wire pitch of less than 100 μm On the other hand, the general production steps of the aforementioned epoxy resin composition for semiconductor encapsulation include the steps of mixing, melt kneading and pulverization, and friction and collision of the composing materials of the aforementioned epoxy resin composition for semiconductor encapsulation with the production device occur in each of these steps. Thus, the aforementioned epoxy resin composition for semiconductor encapsulation is contaminated with conductive foreign metallic particles derived from the aforementioned production device. Also, in addition to the aforementioned cause due to the production device, there is a case in which the aforementioned composing materials themselves are contaminated with conductive foreign metallic particles.

When the aforementioned semiconductor element is encapsulated with an epoxy resin composition for semiconductor encapsulation contaminated with such conductive foreign metallic particles, there is a possibility that the aforementioned foreign particles are caught between metal wires and the like and thereby cause a short-circuit, in the case of the aforementioned narrow pitch semiconductor device.

Accordingly, for the purpose of reducing contamination of the aforementioned conductive foreign metallic particles, a method for removing of the aforementioned conductive foreign metallic particles in the production process of the aforementioned epoxy resin composition for semiconductor encapsulation, for example, using a magnet, has been proposed (e.g., Patent Reference 1).

Patent Reference 1: JP-A-9-173890

DISCLOSURE OF INVENTION

Problems to be Solved by the Invention

According to the aforementioned elimination method which uses a magnet, conductive foreign metallic particles having a large size and ferromagnetic conductive foreign metallic particles can be removed, but elimination of fine conductive foreign metallic particles (having a diameter of about 100 μm or less) and conductive foreign metallic particles of feeble magnetism cannot be carried out sufficiently. Thus, the aforementioned latest narrow pitch semiconductor devices still have a danger of having short circuit.

In addition, in the case of an epoxy resin composition for semiconductor encapsulation which contains a magnetic oxide, the magnetic oxide is also adhered to a magnet, so that the conventional method for eliminating conductive foreign metallic particles using a magnet cannot be used. Thus, even in the case of conductive foreign metallic particles having particularly large size and ferromagnetic conductive foreign metallic particles, they cause a problem in that they remain un-eliminated in the epoxy resin composition for semiconductor encapsulation.

The present invention was made by taking these situations into consideration. An object of the present invention is to provide an epoxy resin composition for semiconductor encapsulation, which does not contain conductive foreign metallic particles having such a size that they cannot be detected and eliminated by the conventional method for eliminating conductive foreign metallic particles, as well as a semiconductor device that uses the same.

Means for Solving the Problems

In order to achieve the above object, a first embodiment of the present invention is an epoxy resin composition for semiconductor encapsulation, comprising the following components (A) to (D), wherein conductive foreign metallic particles having a size of 20 μm or more are not substantially contained in the aforementioned epoxy resin composition:

(A) an epoxy resin, (B) a phenol resin, (C) a hardening accelerator, and (D) an inorganic filler.

In addition, a second embodiment of the present invention is a semiconductor device comprising a semiconductor element and the aforementioned epoxy resin composition for semiconductor encapsulation which encapsulates the semiconductor element.

That is, the present inventors have conducted a series of studies in order to obtain an epoxy resin composition having such a high reliability that a short (short circuit) and the like are not generated even when it is used as a filling material of the latest narrow pitch semiconductor devices. As a result, they found that the intended object can be attained by using an epoxy resin composition having substantially no conductive foreign metallic particles obtained by eliminating conductive foreign metallic particles having a size of 20 μm or more, among conductive foreign metallic particles derived from the composing components of epoxy resin composition and epoxy resin composition production device. Thus, the present invention as accomplished.

EFFECT OF THE INVENTION

Accordingly, the epoxy resin composition for semiconductor encapsulation of the present invention contains substantially no conductive foreign metallic particles having a size of 20 μm or more in the epoxy resin composition. Thus, even when this is used as the encapsulation material for the latest narrow pitch semiconductor devices, short circuit defect does not occur, and highly reliable semiconductor devices are obtained.

In addition, when the aforementioned epoxy resin composition for semiconductor encapsulation contains a magnetic oxide, the magnetic oxide absorbs electromagnetic radiation generated from semiconductor circuits and the like and also absorbs electromagnetic radiation from outside, so that they exert advantages of inhibiting bad influence upon other elements sensitive to electromagnetic radiation and hardly causing operation error of semiconductor elements.

BRIEF DESCRIPTION OF THE DRAWINGS

FIG. 1 is an explanatory drawing showing an embodiment of the conductive foreign metallic particle detection method.

DESCRIPTION OF THE REFERENCE NUMERALS AND SIGNS

T: Epoxy resin composition for semiconductor encapsulation
1: Magnetizer
2: Infrared camera Best Mode for Carrying out the Invention Conductive foreign metallic particles having a size of 20 μm or more are substantially not contained in the epoxy resin composition of the present invention. The phrase "conductive foreign metallic particles having a size of 20 μm or more are substantially not contained" means that the number of the conductive foreign metallic particles having a size of 20 μm or more as detected by the method described in this specification are 5 or less per 1 cm$^3$, preferably 2 or less, and most preferably 0.

The epoxy resin composition for semiconductor encapsulation of the present invention is obtained using an epoxy resin (component A), a phenol resin (component B), a hardening accelerator (component C) and an inorganic filler (component D), and is generally in the form of powder or in the form of a tablet prepared by making the powder into a tablet.

The aforementioned epoxy resin (component A) is not particularly limited and may be a generally used one. For example, a cresol novolak-type, a phenol novolak-type, a bisphenol A-type, a biphenyl-type, a triphenylmethane-type, a naphthalene-type and the like may be cited. These may be used alone or as a mixture of two or more.

The aforementioned phenol resin (component B) exerts its function as a hardening agent for the aforementioned epoxy resin, and is not particularly limited and may be a generally used one. For example, phenol novolak, cresol novolak, bisphenol A-type novolak, naphthol novolak, phenol aralkyl resin and the like may be cited. These may be used alone or as a mixture of two or more.

Regarding the blending ratio of the aforementioned epoxy resin (component A) and phenol resin (component B), it is preferable to bend them in such amounts that phenolic hydroxyl group in the phenol resin becomes from 0.5 to 2.0 equivalents based on 1 equivalent of epoxy group in the epoxy resin. More desirably, this is from 0.8 to 1.2 equivalents.

The hardening accelerator (component C) to be used together with the aforementioned component A and component B is not particularly limited. Examples thereof include those of amine type, phosphorus type and the like. Among them, examples of the amine-type include imidazoles such as 2-imidazole and the like, tertiary amines such as triethanolamine, 1,8-diazabicyclo(5,4,0)undecane-7 and the like. Also, examples of the phosphorus-type include triphenylphosphine, tetraphenylphosphonium-tetraphenyl borate and the like. These may be used alone or as a mixture of two or more. In addition, it is preferable to set the blending ratio of this hardening accelerator to a ratio of from 0.1 to 2.0% by weight based on the total amount of the epoxy resin composition for semiconductor encapsulation. Further, when fluidity of the epoxy resin composition for semiconductor encapsulation is taken into consideration, it is more preferably from 0.15 to 0.35% by weight.

The inorganic filler (component D) to be used together with the aforementioned components A to C is not particularly limited, and it may be any generally used one. For example, quarts glass powder, silica powder, alumina, talc and the like may be cited. Particularly preferably, spherical fused silica powder and pulverized silica powder may be exemplified. These may be used alone or as a mixture of two or more. Also, it is preferable to set the blending ratio of this inorganic filler to a ratio of from 70 to 90% by weight based on the total amount of the epoxy resin composition for semiconductor encapsulation, more preferably from 75 to 90% by weight. In addition, average particle diameter of the aforementioned inorganic filler is preferably from 1 to 150 μm, more preferably from 5 to 75 μm.

According to the invention, in addition to the aforementioned components A to D, a magnetic oxide (component E) may be contained from the viewpoint of electromagnetic radiation shielding (shield) effect. This magnetic oxide is not particularly limited, and it may be any generally used one. For example, iron oxide, cupper oxide, barium titanate, ferrite and the like may be cited. Also, it is preferable to set the blending ratio of this magnetic oxide to a ratio of from 20 to 90% by weight based on the total amount of the epoxy resin composition for semiconductor encapsulation, more preferably from 30 to 70% by weight. In addition, average particle diameter of the aforementioned magnetic oxide is preferably from 1 to 100 μm, more preferably from 3 to 50 μm.

In this connection, when the aforementioned magnetic oxide (component E) is contained, this magnetic oxide also generates a exothermic reaction by the induction heating in the method for detecting conductive foreign metallic particles, which is described later. Since the magnetic oxide and the conductive foreign metallic particles have different rate of temperature rise (conductive foreign metallic particles is higher), they may be distinguished in detection and the conductive foreign metallic particles alone may be removed.

In addition to the aforementioned components A to E, as occasion demands, other additive agents such as halogen bound flame retardants (e.g., brominated epoxy resin and the like), flame retardant assisting agents (e.g., antimony trioxide and the like), silane coupling agents (e.g., β-(3,4-epoxycyclohexyl)ethyltrimethylsilane, γ-glycidoxypropyltrimethoxysilane and the like), mold release agents (e.g., carnauba wax and the like) may be optionally used in the epoxy resin composition for semiconductor encapsulation.

The epoxy resin composition for semiconductor encapsulation of the present invention may be produced, for example, in the following manner. That is, this may be produced by a series of steps of blending the aforementioned components A to D, the component E in some cases and other additive agents as occasion demands, applying the mixture to a kneader such as a mixing roller or the like to carry out its melt-kneading under heated condition, cooling this to room temperature, and then pulverizing this by employing a conventionally known method, and making this into tablets as occasion demands.

Whether or not the thus obtained epoxy resin composition for semiconductor encapsulation is contaminated with conductive foreign metallic particles having a size of 20 μm or more, derived from the aforementioned respective composing components an epoxy resin composition production device (e.g., a kneader such as a mixing roller or the like), is detected, and they are removed when present. In this manner, an epoxy resin composition which does not substantially contain conductive foreign metallic particles having a size of 20 μm or more, derived from the composing components an epoxy resin composition production device, is obtained. That is, in the case of conductive foreign metallic particles having a size of less than 20 μm, they are so small that it is difficult to detect them by current devices, and even when taken into consideration that metal wire pitch in the latest semiconductor devices is less than 100 μm, it is considered that elimination of conductive foreign metallic particles having a size of larger than 20 μm, as the critical value, is sufficient.

The method for filling a semiconductor element using such an epoxy resin composition is not particularly limited and may be carried out by employing a conventionally known molding method such as a general transfer molding or the like, and a semiconductor device may be obtained thereby.

Next, the method for detecting and eliminating the aforementioned conductive foreign metallic particles is described.

According to the present invention regarding the detection and elimination of conductive foreign metallic particles, various eliminating and contamination-preventing methods may be used in optional combination. For example, regarding the raw materials as the composing components, detection and elimination by the induction heating which is described later and elimination by a magnet are possible. Also, regarding the devices to be used in the production process of the epoxy resin composition, such as a mixer for mixing the raw materials, a kneader for carrying out melt kneading of the mixed raw materials, a roller for cooling and rolling the melt-kneaded epoxy resin composition, various types of mill for pulverizing the rolled sheet-shaped epoxy resin composition, a tablet making machine for making the pulverized epoxy resin composition into tables and the like, they may be made of such hard materials that their fragments become less than 20 μm even when abrasion occurred due to their hardness. In addition, detection and elimination of the conductive foreign metallic particles in the pulverized epoxy resin composition by the induction heating and their elimination by a magnet are also possible. However, because of its characteristics, the aforementioned elimination by a magnet cannot be used for magnetic oxides or an epoxy resin composition which contains a magnetic oxide.

The aforementioned method for detecting conductive foreign metallic particles is described based on the drawing.

FIG. 1 shows an embodiment of the method for detecting conductive foreign metallic particles. This method for detecting conductive foreign metallic particles is carried out by passing a tablet-shaped epoxy resin composition for semiconductor encapsulation T through the magnetic flux generated by a magnetizer 1. When conductive foreign metallic particles are present in the aforementioned epoxy resin composition for semiconductor encapsulation T, the conductive foreign metallic particles become a state to receive induction heating by the aforementioned magnetic flux and generate heat. Thus, when temperature distribution of the epoxy resin composition for semiconductor encapsulation T is measured by an infrared camera 2, the parts at which aforementioned conductive foreign metallic particles exist show a locally high temperature, so that the aforementioned conductive foreign metallic particles may be detected. Thereafter, the aforementioned conductive foreign metallic particles which showed the high temperature are removed.

By such a method for detecting conductive foreign metallic particles, it is possible to detect a conductive foreign metallic particle having a diameter of 100 μm or less, or a stainless steel or the like conductive foreign metallic particle (magnetic oxide or the like) that does not adhere to a magnet, of which detection is difficult by the conventional method using a magnet. However, as described in the foregoing, even by the aforementioned method for detecting conductive foreign metallic particles, it is still difficult at present to detect the particles having a size (diameter) of less than 20 μm, which is too small. However, this is sufficient when the fact that the metal wire pitch of the latest semiconductor devices is less than 100 μm is taken into consideration.

More illustratively, the aforementioned magnetizer 1 is equipped with two facing magnetic poles 11a and 11b, a yoke 12 which connects both of these magnetic poles 11a and 11b and a coil 13 arranged in the central part of this yoke 12, and this coil 13 connected to a magnetizing power circuit 14. When a high frequency current (25 to 70 kHz) is supplied from the magnetizing power circuit 14 to the coil 13, the coil 13 generates a high frequency magnetic flux. This high frequency magnetic flux refluxes a magnetic path of the yoke 12, one magnetic pole 11a, the other magnetic pole 11b and the yoke 12.

Also, a conveyor 3 is arranged between the aforementioned magnetic poles 11a and 11b, for mounting the epoxy resin composition for semiconductor encapsulation T, and the conveyor 3 is arranged in such a manner that it moves in a direction orthogonal to the magnetic flux between the both magnetic poles 11a and 11b. By the movement of the aforementioned conveyor 3, the epoxy resin composition for semiconductor encapsulation T mounted thereon passes in order through the magnetic flux between the both magnetic poles 11a and 11b.

The aforementioned infrared camera 2 is arranged on the upper side of a space between the both magnetic poles 11a and 11b, such that it can measure temperature distribution of the epoxy resin composition for semiconductor encapsulation T passing through the magnetic flux. Also, the infrared camera 2 is connected to a monitor 22 and a foreign matter detection circuit 23 via a photographing controlling circuit 21. Controlled by the photographing controlling circuit 21, the infrared camera 2 catches infrared rays emitted from the epoxy resin composition for semiconductor encapsulation T and converts them into electric signals. Thereafter, the aforementioned photographing controlling circuit 21 sends the electric signals to the monitor 22 and foreign matter detection circuit 23. Based on the electric signals, the monitor 22 displays a temperature distribution image on the screen, and the presence of conductive foreign metallic particles and their existing positions may be recognized with the naked eye from the temperature distribution image. In addition, the aforementioned foreign matter detection circuit 23 judges the presence of conductive foreign metallic particles by comparing measured electric signals from the epoxy resin composition for semiconductor encapsulation T with electric signals from the epoxy resin composition for semiconductor encapsulation T in which conductive foreign metallic particles are not present (input in advance). When conductive foreign metallic particles are present, this circuit sends a foreign matter detection signal.

In this connection, the infrared camera 2 was used in the aforementioned embodiment for the measurement of temperature distribution, but instead of this, a radiation thermometer, a thermography or the like may also be used. In addition, detection of conductive foreign metallic particles was carried out on the epoxy resin composition for semiconductor encapsulation T which was formed in a tablet shape, but this may also be carried out on the powder before forming into tablet.

In addition, as the method for detecting and eliminating them by the aforementioned induction heating from raw materials as the composing components and powder form epoxy resin composition, a suction recovery machine for conductive foreign metallic particles may be used. In addition, in the case of a tablet form, tablets containing a conductive foreign metallic particle having a predetermined particle diameter or more may be removed by arranging a screening gate on a tablet passage.

The step for detecting and eliminating conductive foreign metallic particles by the aforementioned induction heating method may be carried out at any arbitrary step during the production process of the epoxy resin composition for semiconductor encapsulation. In order to prevent contamination with conductive foreign metallic particles originated from the production apparatus as described in the foregoing, it is particularly preferable to carry out the step after the tablet making as the final step of the production process.

Next, Examples are described together with Comparative Examples.

Firstly, respective components shown below were prepared.

Epoxy Resin:
A biphenyl-type epoxy resin represented by the following general formula (a) (epoxy equivalent 192, melting point 100° C.).

[Chem. 1]

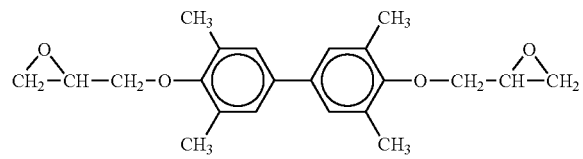

(a)

Phenol Resin:
A phenol aralkyl resin represented by the following general formula (b) (hydroxyl group equivalent 170, melting point 83° C.).

[Chem. 2]

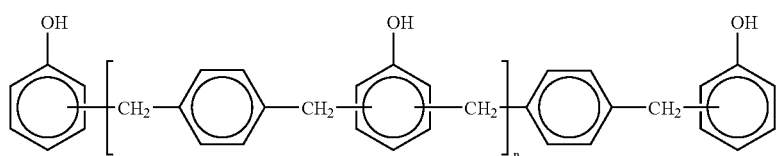

(b)

Hardening Accelerator:
Triphenylphosphine (TPP).

Inorganic Filler a:
A spherical fused silica having an average particle diameter of 30 μm.

Inorganic Filler b:
A spherical fused silica having an average particle diameter of 1 μm.

Magnetic Oxide:
An Ni—Zn system spherical ferrite having an average particle diameter of 30 μm.

Mold Release Agent:
Carnauba wax.

EXAMPLE 1

Examples 1 and 2, Comparative Examples 1 and 2

Respective components shown in the following Table 1 were mixed at the ratio shown in the same table and melt-kneaded for 3 minutes using a mixing roller (temperature 100° C.). Next, this melted matter was cooled to room temperature (25° C.) and then pulverized to obtain powder form epoxy resin composition for semiconductor encapsulation. Thereafter, this was processed into a tablet form (diameter 25 mm, thickness 30 mm) using a tablet making machine.

In the Examples 1 and 2, each of the components was used after detecting and eliminating conductive foreign metallic particles having a size of 20 µm or more in accordance with the conductive foreign metallic particle detection method shown in the following, In addition, as the material of the aforementioned mixing roller, a hard metal having a high hardness was used, so that the maximum diameter of the foreign particles becomes less than 20 µm even when the material is worn was used. Thus, an epoxy resin compositions which contain substantially no observable conductive foreign metallic particles having a size of 20 µm or more was obtained. On the other hand, in the Comparative Examples 1 and 2, powder form epoxy resin compositions were obtained by using respective components as they were when purchased, and using a carbon steel having a hardness of lower than the hard metal as the material of each device of the aforementioned mixing roller, kneader and mill.

Detection of Conductive Foreign Metallic Particles:

In the aforementioned Examples 1 and 2, detection of conductive foreign metallic particles for each of the used components was carried out by the aforementioned conductive foreign metallic particle detection method using the device shown in FIG. 1. That is, each of the tablets of Examples 1 and 2 was positioned for 6 seconds between yokes of the magnetizer which is driven at a frequency of 70 kHz. Thus, metallic particles which were selectively heated with inductive current were detected by infrared camera.

TABLE 1

| | Example | | Comparative Example | |
|---|---|---|---|---|
| | 1 | 2 | 1 | 2 |
| | (weight parts) | | | |
| Epoxy resin | 100 | 100 | 100 | 100 |
| Phenol resin | 89 | 89 | 89 | 89 |
| Hardening accelerator | 3 | 3 | 3 | 3 |
| Inorganic filler a | 700 | 370 | 700 | 370 |
| Inorganic filler b | 10 | 30 | 100 | 30 |
| Magnetic oxide | — | 400 | — | 400 |
| Mold release agent | 3 | 3 | 3 | 3 |
| Presence or absence of the detection and removal of conductive foreign metallic particles in raw materials | ◯ | ◯ | X | X |
| Presence or absence of ultra hardening of device materials | ◯ | ◯ | X | X |

Each of the thus obtained powder form epoxy resin compositions of Examples and Comparative Examples was dissolved in acetone, and then the inorganic fillers (silica powders) and magnetic oxide alone were picked up to measure to measure maximum particle diameter of the conductive foreign metallic particles contained in each epoxy resin composition using an optical microscope. The results are shown in the following Table 2. In addition, discrimination between the aforementioned magnetic oxide and conductive foreign metallic particles may be verified in the following manner. That is, since all of the conductive foreign metallic particles contained in the raw materials and the worn conductive foreign metallic particles formed by the wearing of devices and contaminated during the production process show a pulverized shape, it is possible to separate them from the spherical shape of magnetic oxides based on the shapes.

In order to verify short-circuit defect by the contamination of conductive foreign metallic particles, evaluation of defect of short circuit was carried out in accordance with the following method, by preparing semiconductor devices using each of the aforementioned epoxy resin compositions. The results are shown in the following Table 2.

Evaluation of Short Circuit Defect:

Each epoxy resin composition was made into tablets using a tablet making machine. Using each of the thus obtained tablet-shaped epoxy resin compositions, a semiconductor element (chip size: 10 mm×10 mm) was subjected to transfer molding (condition: 175° C.×120 seconds) and further subjected to post hardening of 175° C.×5 hours, thereby preparing a semiconductor device. The thus obtained semiconductor device is a 208 pin QFP (quad flat package).

Package Shape:

A 208 pin QFP (quad flat package) type: size 28 mm×28 mm×2.8 mm in thickness

Semiconductor element size: 10 mm×10 mm×370 µm in thickness

Metal lead frame: made of copper (size: 11 mm×11 mm×100 µm in thickness)

Wire: made of gold, diameter 20 µm, pitch 80 µm, inter-wire distance 60 µm

TABLE 2

| | Example | | Comparative Example | |
|---|---|---|---|---|
| | 1 | 2 | 1 | 2 |
| Maximum particle diameter of conductive foreign metallic particles (µm) | 18 | 18 | 110 | 110 |
| Evaluation of short circuit defect (/20 samples) | 0 | 0 | 20 | 20 |

As a result of the above, it is clear that maximum particle diameter of the conductive foreign metallic particles contained in the epoxy resin compositions of the Examples was less than 20 µm and that short circuit defect did not occur and highly reliable semiconductor devices were obtained. Contrary to this, maximum particle diameter of the conductive foreign metallic particles contained in the epoxy resin compositions of the comparative examples was 110 µm, greatly exceeding 20 µm, and short circuit defect occurred in the semiconductor devices.

While the invention has been described in detail and with reference to specific embodiments thereof, it will be apparent to one skilled in the art that various changes and modifications can be made therein without departing from the scope thereof.

This application is based on Japanese patent application No. 2004-312730 filed Oct. 27, 2004, the entire contents thereof being hereby incorporated by reference.

INDUSTRIAL APPLICABILITY

The present invention relates to an epoxy resin composition for semiconductor encapsulation which does not substantially contain conductive foreign metallic particles having a predetermined size or more and from which a high reliability semiconductor device can be obtained, as well as a semiconductor device that uses the same.

The invention claimed is:

1. An epoxy resin composition for semiconductor encapsulation, comprising the following components (A) to (E), wherein conductive foreign metallic particles having a size of 20 μm or more are substantially not contained in the aforementioned epoxy resin composition:
   (A) an epoxy resin,
   (B) a phenol resin,
   (C) a hardening accelerator,
   (D) an inorganic filler, and
   (E) a magnetic oxide.

2. A semiconductor device comprising a semiconductor element and an epoxy resin composition for semiconductor encapsulation according to claim 1 which encapsulates the semiconductor element.

3. A semiconductor device comprising a semiconductor element and an epoxy resin composition for semiconductor encapsulation according to claim 1 which encapsulates the semiconductor element.

* * * * *